(12) United States Patent
Lee

(10) Patent No.: US 7,348,282 B2
(45) Date of Patent: Mar. 25, 2008

(54) FORMING METHOD OF GATE INSULATING LAYER AND NITROGEN DENSITY MEASURING METHOD THEREOF

(75) Inventor: Sang Yong Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 20 days.

(21) Appl. No.: 11/024,849

(22) Filed: Dec. 30, 2004

(65) Prior Publication Data

US 2005/0142816 A1 Jun. 30, 2005

(30) Foreign Application Priority Data

Dec. 31, 2003 (KR) .................. 10-2003-0101189

(51) Int. Cl.
*H01L 21/31* (2006.01)
(52) U.S. Cl. ............... 438/786; 438/258; 257/324; 257/E21.302
(58) Field of Classification Search ............ 438/591, 438/275, 283, 981, 786, 762, 763, 258; 257/638, 257/324, E21.302
See application file for complete search history.

(56) References Cited

U.S. PATENT DOCUMENTS

| | | | | |
|---|---|---|---|---|
| 6,110,842 A | * | 8/2000 | Okuno et al. | 438/776 |
| 6,258,673 B1 | * | 7/2001 | Houlihan et al. | 438/275 |
| 6,331,492 B2 | * | 12/2001 | Misium et al. | 438/762 |
| 6,383,861 B1 | * | 5/2002 | Gonzalez et al. | 438/241 |
| 6,734,113 B1 | * | 5/2004 | Cho et al. | 438/763 |
| 2002/0137287 A1 | * | 9/2002 | Takebuchi | 438/258 |

* cited by examiner

*Primary Examiner*—B. William Baumeister
*Assistant Examiner*—Steven J. Fulk
(74) *Attorney, Agent, or Firm*—Lowe Hauptman Ham & Berner LLP

(57) ABSTRACT

A method of forming a gate insulating layer and nitrogen density measuring method thereof, by which a transistor having enhanced electric characteristics can be fabricated without employing separate ion implantation in a manner of providing parameters for enhancing perfection of the transistor via nitridation measurement. The method includes forming a first oxide layer on a silicon substrate having first to fourth regions defined thereon, patterning the first oxide layer in the first and fourth regions to have a predetermined thickness, and forming a nitride layer on the oxide layer in the third and fourth regions.

8 Claims, 4 Drawing Sheets

J  K  L  M  N O  P

FORMING METHOD OF GATE INSULATING LAYER AND NITROGEN DENSITY MEASURING METHOD THEREOF

BACKGROUND OF THE INVENTION

1. Field of the Invention

The present invention relates to a method for forming a gate insulating layer and nitrogen density measuring method thereof, in which a thin layer is not grown by a conventional method using NO or $NO_2$ and by which a transistor having enhanced electrical characteristics can be fabricated without employing a separate ion implantation process in a manner of providing parameters for enhancing perfection of the transistor via nitridation measurement.

2. Discussion of the Related Art

Generally, an insulating layer of a transistor has been reduced in thickness as increasingly higher degrees of device integration are achieved. A silicon oxide layer, which becomes thinner, is vulnerable to initial insulation failure or degradation of electrical characteristics such as time-delay insulation breakdown, transistor characteristics, etc. Moreover, Boron (B) as a dopant of a P+ polysilicon electrode penetrates the silicon oxide layer into a substrate during annealing. Thus, the electrical characteristics are degraded because dangling bonds exist at an interface between the oxide layer and a basic silicon layer considerably affect the electrical property of the oxide layer.

To overcome such a problem, methods of improving the electrical characteristics in a manner of oxidizing a surface of a silicon layer and forming a nitrogen-based diffusion barrier within the silicon oxide layer have been proposed. For instance, there is an annealing method using NO or $NO_2$. The annealing method needs a process temperature of at least 1,000° C. to improve the electrical characteristics, thereby causing a problem of thermal budget to a layer. The thermal budget refers to a lowering of threshold voltage (or other device characteristic) that is adversely influenced by exposing one or more layers of a device to a high temperature. Besides, there are various methods of injecting nitrogen into an insulating layer such as a method of growing an insulating layer using NO, a method using plasma, etc.

In a lamp heating type sheet handler disclosed in Japanese Patent Laid-Open No. 93-251428, dry oxidization is carried out on a silicon substrate to form a silicon oxide layer. The silicon oxide layer is then processed with an oxidative gas containing nitrogen to form a silicon oxide-nitride layer.

FIG. 1 is a graph of temperature vs. time for forming an oxide-nitride layer according to a related art.

Referring to FIG. 1, a silicon substrate is loaded in a process chamber. A silicon oxide layer is then formed by performing oxidization on the silicon substrate in a manner of heating the substrate at 1,000° C. during a section-L in FIG. 1 by inputting an oxidative gas excluding nitrogen, e.g., dry $O_2$, to the process chamber. And, a section-K is a temperature rise section. In doing so, the substrate is heated by an infrared lamp and rapid heating is used at 50~200° C./sec. A temperature sustain time for oxidization at 1,000° C. is set to about 10 sec. And, a process pressure for oxidization is set to about 760 Torr. Once a vacuum state is provided to the process chamber while the silicon substrate remains at about 1,000° C., an oxidative gas containing nitrogen is inputted to the process chamber during a section-M so that the silicon oxide layer can turn into a silicon oxide-nitride layer. In doing so, the oxidative gas containing nitrogen is at least one selected from the group consisting of NO, $NO_2$, and $N_2O$. And, a temperature sustain time for oxidation-nitridation is set to about 30 seconds. Moreover, a process pressure for oxidation-nitridation is set to about 760 Torr. Sections J, N, O and P relate to other processing steps not further described herein.

Korean Patent Application Laid-Open No. 2003-0042873 discloses a quantification method of nitrogen density in an interface between a silicon substrate and a silicon oxide layer, in which density of nitrogen contained in the interface between the silicon substrate and the silicon oxide layer is quantified. In an analysis sample in which a silicon oxide layer is stacked on a silicon substrate, a strength of SiN ion and strength of SiON are measured per vertical depth toward a bottom of the silicon substrate from a surface of the silicon oxide layer. From the strengths of the ions, half maximum widths of SiN and SiON are calculated, respectively. By squaring to add the half maximum width of SiN and the half maximum width of SiON, the density of nitrogen existing in the interface between the silicon substrate and the silicon oxide layer is quantified. In doing so, the ion strength is measured by a secondary ion mass spectrometer. Since the matrix effect can be corrected by the above method, the nitrogen density of the interface between the silicon substrate and the silicon oxide layer can be precisely measured.

However, as recognized by the present inventor, in the related art method of forming the thin gate insulating layer, a short channel effect occurs and boron (B) penetrates the silicon oxide layer to the substrate.

SUMMARY OF THE INVENTION

Accordingly, the present invention is directed to a forming method of a gate insulating layer and nitrogen density measuring method thereof that substantially obviate the above-identified and other problems due to limitations and disadvantages of the related art.

An object of the present invention is to provide a forming method of a gate insulating layer and nitrogen density measuring method thereof, in which a thin layer is not grown by the related art method using NO or $NO_2$ and by which a transistor having enhanced electric characteristics can be fabricated without employing separate ion implantation in a manner of providing parameters for enhancing perfection of the transistor via a nitridation measurement.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming a gate insulating layer according to the present invention includes the step of forming a first oxide layer on a silicon substrate having first to fourth regions defined thereon, patterning the first oxide layer in the first and fourth regions to have a predetermined thickness, and forming a nitride layer on the oxide layer in the third and fourth regions.

In another aspect of the present invention, a method of measuring a nitrogen density of a gate insulating layer includes the steps of measuring a reference threshold voltage of a transistor including a gate insulating layer formed of oxide-nitride layer having a reference amount of nitrogen component, measuring a first threshold voltage of a first transistor including a gate insulating layer formed of oxide layer, measuring a second threshold voltage of a second transistor including a gate insulating layer formed of oxide-nitride layer having a nitrogen component, comparing the second threshold voltage with the reference threshold voltage and the first threshold voltage, and calculating a nitrogen density of the gate insulating layer of the second transistor according to the comparison.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2 to 8 are cross-sectional diagrams for explaining a method of forming a gate insulating layer according to the present invention.

Figure 1:
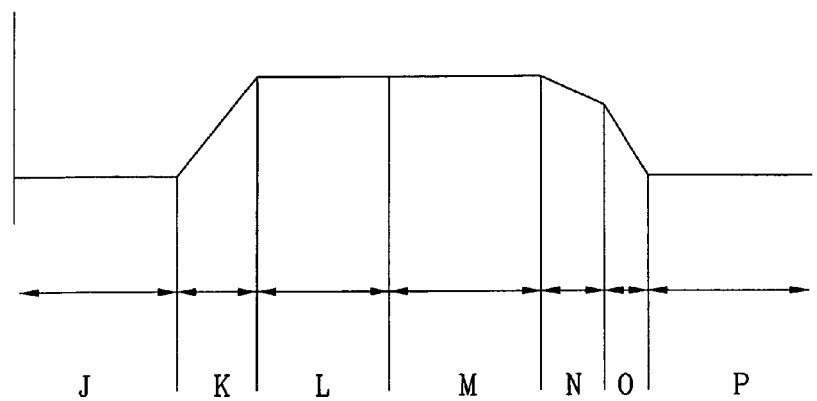
FIG. 1 is a graph of temperature vs. time for forming an oxide-nitride layer according to a related art.
Figure 2:
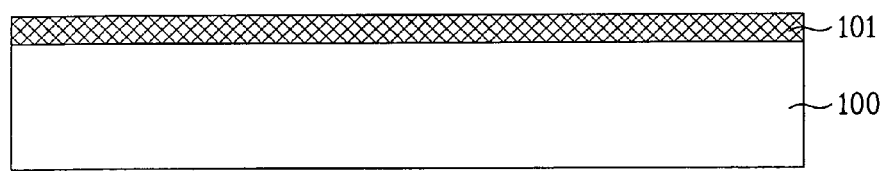
FIGS. 2 to 8 are cross-sectional diagrams of a method of forming a gate insulating layer according to the present invention.

Referring to FIG. 2, after an active area and an isolation area have been formed on a silicon substrate 100, a first oxide layer 101 is formed with about a 20 Å thickness on the silicon substrate 100, so as to define first to fourth regions (successively defined from left to right) as will become apparent.

Figure 3:
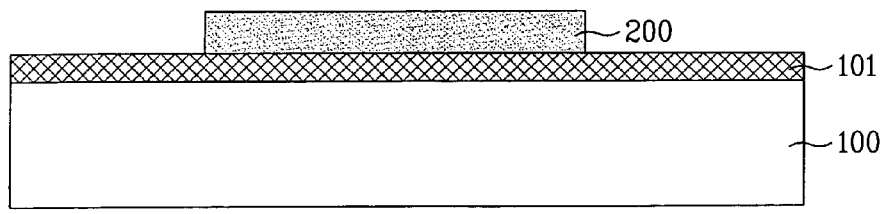

Referring to FIG. 3, a photoresist pattern 200 is formed on the first oxide layer 101 in the second and third regions. The photoresist pattern 200 is to define areas for forming two transistors having different threshold voltages, and more particularly, 1.8V and 3.3V.

Figure 4:
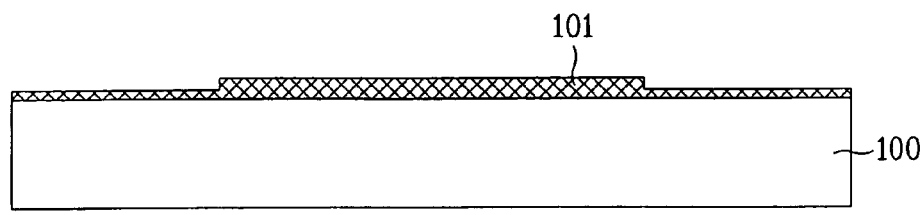

Referring to FIG. 4, the first oxide layer 101 in the first and fourth regions is etched at a predetermined thickness by HF wet etch using the photoresist pattern 200 as a mask. At this time, the HF wet etch is carried out for about 300 seconds. And, the photoresist pattern 200 is then removed.

Figure 5:
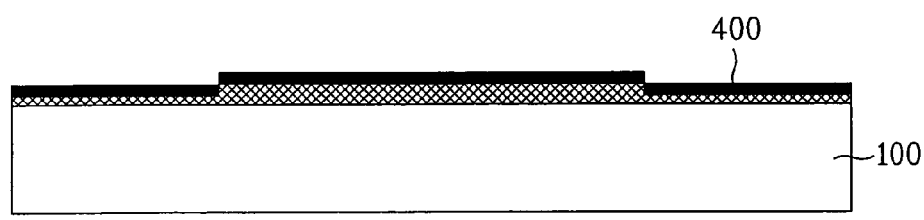

Referring to FIG. 5, an oxide-nitride layer 400 is formed on the first oxide layer 101. The oxide-nitride layer 400 is formed by RTN (rapid thermal nitridation).

Figure 6:
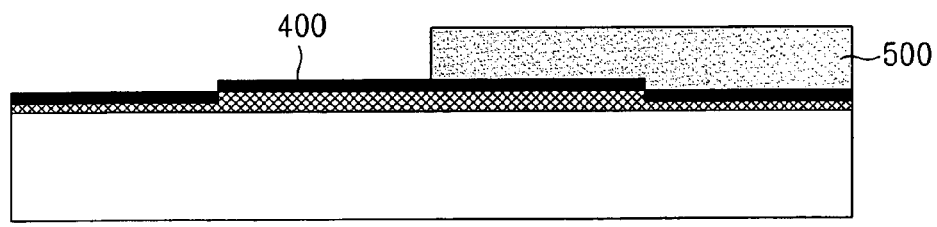

Referring to FIG. 6, a photoresist pattern 500 is formed on the oxide-nitride layer 400 in the third and fourth regions to define a first area for forming two transistors having different threshold voltages of 1.8V and 3.3V using an oxide layer as a gate insulating layer and a second area for forming two transistors having different threshold voltages of 1.8V and 3.3V using oxide-nitride layers as the gate insulating layer.

Figure 7:
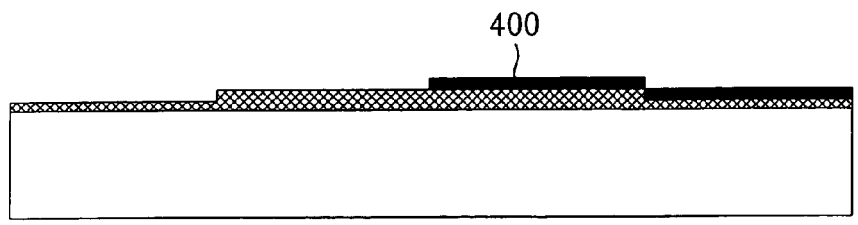

Referring to FIG. 7, the oxide-nitride layer 400 in the first and second regions is etched by $H_3PO_4$ wet etch using the photoresist pattern 500 as a mask, to expose the first oxide layer 101. And, the photoresist pattern 500 is then removed.

Hence, the oxide-nitride layer 400 remains in the third and fourth regions only.

Figure 8:
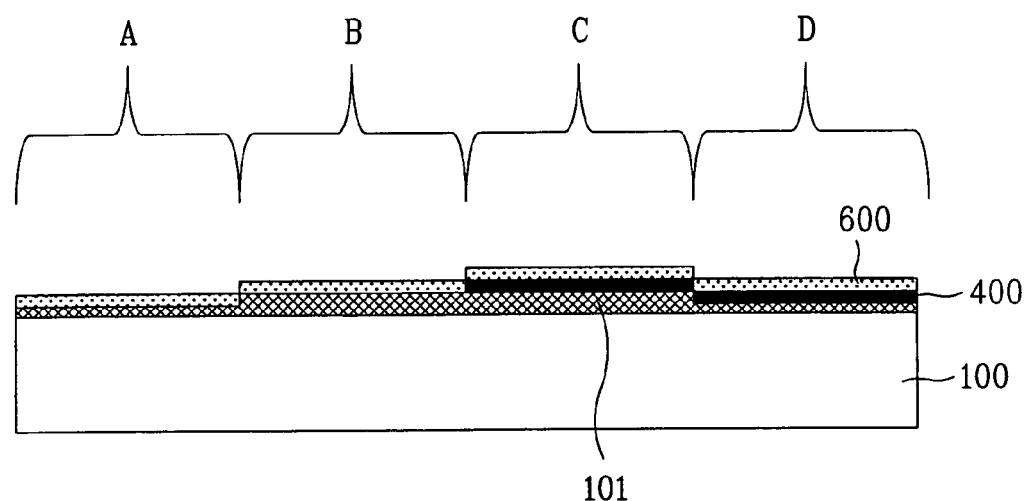

Referring to FIG. 8, a second oxide layer 600 is formed on the substrate including the first oxide layer 101 and the oxide-nitride layer 400.

Hence, the substrate can be divided into region-A, region-B, region-C, and region-D. The region-A and region-B are provided to the first area for forming two transistors having different threshold voltages of 1.8V and 3.3V using silicon oxide as the gate insulating layer. The region-C and region-D are provided to the second area for forming two transistors having different threshold voltages of 1.8V and 3.3V using silicon oxide-nitride as the gate insulating layer.

In other words, the region-A is associated with the first area for forming the transistor having the threshold voltage of 1.8V using silicon oxide as the gate insulating layer, and the region-B is provided to form the transistor having the threshold voltage of 3.3V using silicon oxide as the gate insulating layer.

The region-C is provided to form the transistor having the threshold voltage of 1.8V using silicon oxide-nitride as the gate insulating layer, and the region-D is provided to form the transistor having the threshold voltage of 3.3V using silicon oxide-nitride as the gate insulating layer.

Figure 9:
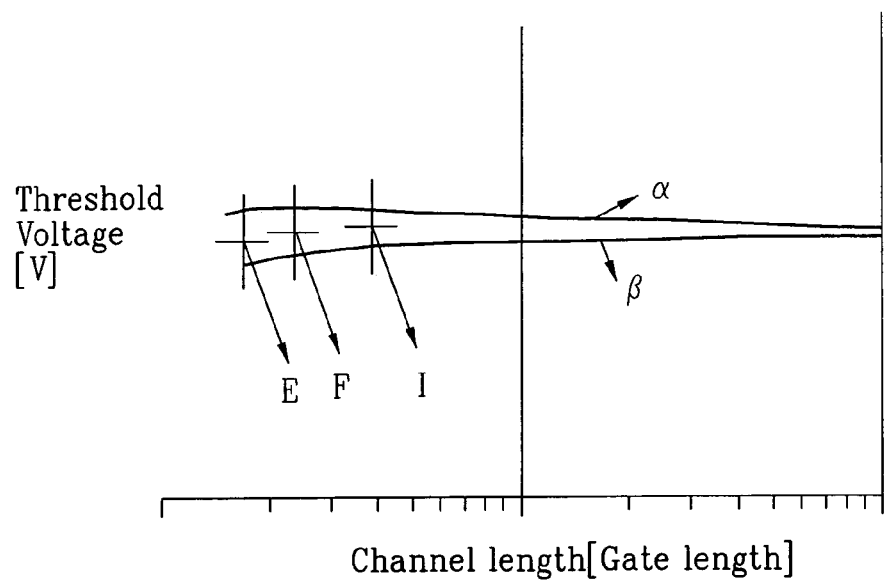
FIG. 9 is a graph of a threshold voltage depending on a channel (gate) length according to the present invention.

FIG. 9 is a graph of a threshold voltage depending on a channel (gate) length according to the present invention.

Referring to FIG. 9, the transistor using the oxide-nitride layer in FIG. 8 differs from the transistor using the oxide layer in FIG. 8 in electric characteristics.

A curve α indicates the threshold voltage of the transistor in the region-A or region-B shown in FIG. 8. And, a curve β indicates a reference threshold voltage of a transistor having the gate insulating layer formed of the silicon oxide-nitride layer having 40% of nitrogen component.

The short channel effect, as shown in the graph, takes place when employing the oxide-nitride layer.

Figure 10:
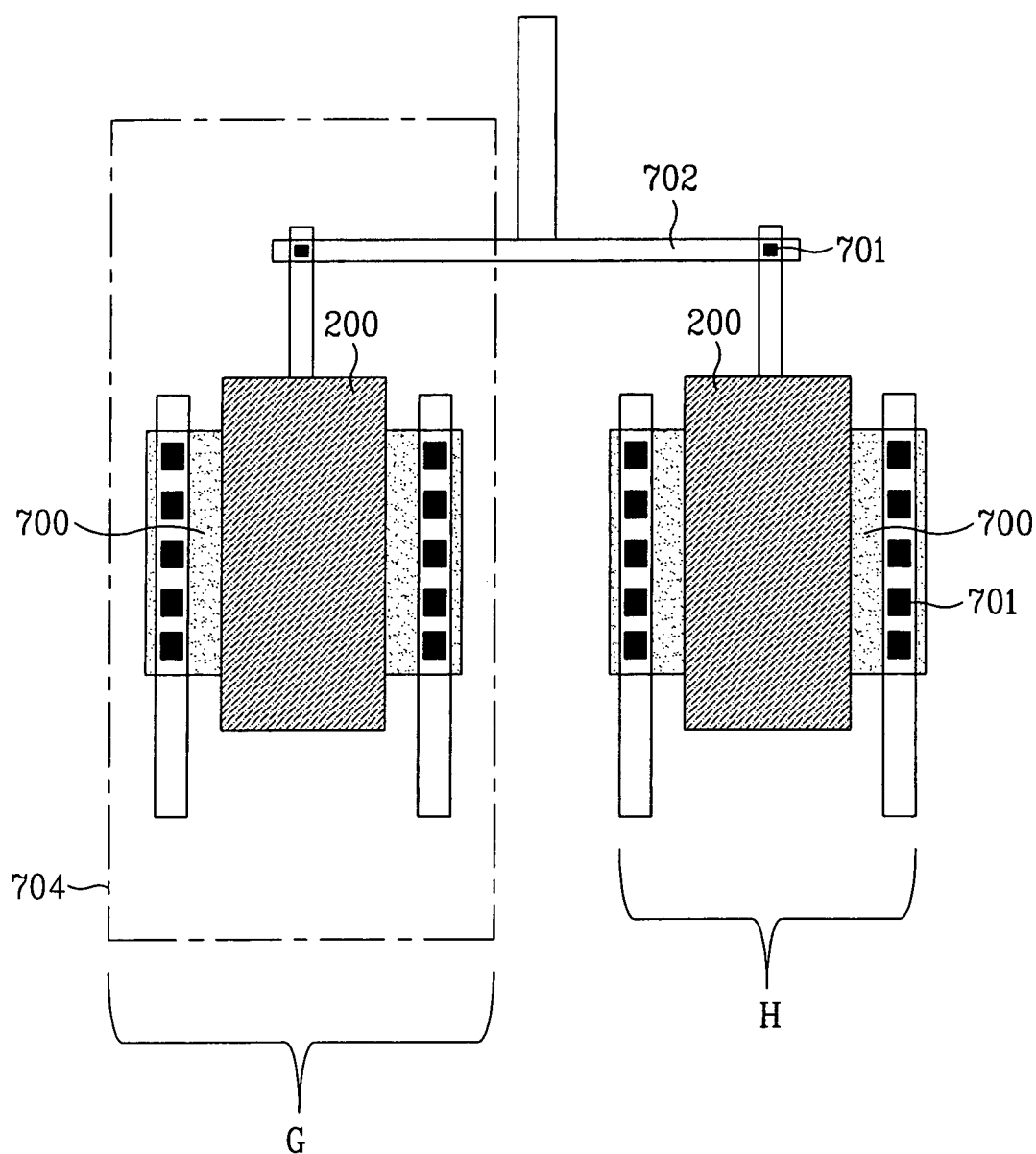
FIG. 10 is a layout of transistors according to the present invention.

FIG. 10 is a layout of transistors according to the present invention.

Referring to FIG. 10, a transistor includes a gate 200, an active area 700 for substantial operation of a transistor, a contact 701 supplying a current to the transistor, and metal lines 702 and 703 connecting a gate and source/drain of the transistor.

A transistor G is formed in the first area, i.e., the region-A or region-B, wherein the transistor G has the gate insulating layer formed of oxide layer.

And, a transistor H is formed in the second area, i.e., the region-C or region-D, wherein the transistor H has the gate insulating layer formed of oxide-nitride layer.

It is assumed the transistors G and H are formed in the region-A and the region-D with the operational voltage of 1.8V or the region-B and the region-C with the operational voltage of 3.3V, respectively. Besides, ion implantation has been performed on the transistors to fit their specific or general purposes.

When the electrical characteristics of the transistors G and H are measured, if the threshold voltage of the transistor G corresponds to the curve α in FIG. 9, and the threshold voltage of the transistor H corresponds to points E, F, or I between the curves α and β, it is assumed the transistor H includes a gate insulating layer having 20% of nitrogen component.

Accordingly, in the forming method of the gate insulating layer and nitrogen density measuring method thereof according to the present invention, the thin layer is not grown by the related art method using NO or $NO_2$ and the transistors having enhanced electric characteristics can be fabricated without employing separate ion implantation in a manner of providing parameters for enhancing perfection of the transistor via nitridation measurement.

And, the present invention can expand the scope of designing transistors of a semiconductor chip.

The present invention claims the benefit of Korean patent application No. P2003-0101189 filed on Dec. 31, 2003, the entire contents of which is hereby incorporated by reference.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a gate insulating layer, comprising the steps of:
   forming a first gate insulating oxide layer on a silicon substrate having first to fourth regions defined thereon;
   patterning the first gate insulating oxide layer in the first and fourth regions so that the thickness of the first gate insulating oxide layer in the first and fourth regions becomes different from the thickness of the first gate insulating oxide layer in the second and third regions; and
   forming an oxide-nitride layer on the first gate insulating oxide layer in the third and fourth regions after the patterning step.

2. The method of claim 1, further comprising forming a second gate insulating oxide layer to cover the patterned first gate insulating oxide layer and the oxide-nitride layer.

3. The method of claim 1, wherein the step of forming the oxide-nitride layer comprises a step of rapid thermal annealing.

4. The method of claim 1, wherein the patterning step comprises patterning the first gate insulating oxide layer by wet etching.

5. The method of claim 4, wherein the wet etching uses a HF etchant.

6. The method of claim 1, wherein the step of forming the oxide-nitride layer comprises:
   forming an oxide-nitride on the first gate insulating oxide layer in the first to fourth regions; and
   removing the oxide-nitride layer from the first and second regions.

7. The method of claim 6, wherein the step of removing the nitride layer comprises removing the nitride layer by wet etching.

8. The method of claim 7, wherein the wet etching uses a $H_3PO_4$ etchant.

* * * * *